(12) United States Patent
Sato

(10) Patent No.: US 6,528,996 B1
(45) Date of Patent: Mar. 4, 2003

(54) DIFFUSION-WEIGHTED IMAGING METHOD AND APPARATUS FOR FAST PULSE SEQUENCE WITH MPG PULSES

(75) Inventor: Hiroshi Sato, Tokyo (JP)

(73) Assignee: GE Yokogawa Medical Systems, Limited, Tokyo (JP)

( * ) Notice: Subject to any disclaimer, the term of this patent is extended or adjusted under 35 U.S.C. 154(b) by 0 days.

(21) Appl. No.: 09/670,931

(22) Filed: Sep. 28, 2000

(30) Foreign Application Priority Data

Oct. 18, 1999 (JP) .......................................... 11-294954

(51) Int. Cl.[7] ................................................ G01V 3/00
(52) U.S. Cl. ...................................... 324/307; 324/309
(58) Field of Search ................................. 324/307, 309

(56) References Cited

U.S. PATENT DOCUMENTS

| | | | | |
|---|---|---|---|---|
| 5,406,947 A | * | 4/1995 | Kimura ........................ | 324/307 |
| 5,572,124 A | * | 11/1996 | Bito et al. ................... | 324/307 |
| 5,685,304 A | * | 11/1997 | Tsukamoto .................. | 324/307 |
| 6,144,202 A | * | 11/2000 | Kanazawa et al. ........... | 324/307 |
| 6,433,547 B2 | * | 8/2002 | Kabasawa et al. .......... | 324/314 |

OTHER PUBLICATIONS

Kim Butts etal Diffusion weighted interleaved echo planar imaging with a pair of orthogonal navigator echoes; MRM vol. 35, pp 763–770 (1996).

Theodore P. Trouard et al "Analysis and comparison of motion correction techniques in diffusion weighted imaging" JRMI vol. 6, pp 925–935 (1996).

Neville Gai, etal "Elimination of Nyquist ghosts in MRI by using fast linogram imaging", JMRI vol. 7, pp 1166–1169 (1997).

* cited by examiner

*Primary Examiner*—Edward Lefkowitz
*Assistant Examiner*—Dixomara Vargas
(74) *Attorney, Agent, or Firm*—Moonray Kojima

(57) ABSTRACT

An MRI apparatus, which is intended to produce a diffusion-weighted image in a short scan time without being affected by as light motion of the subject, applies an excitation RF pulse R90 and a slice-select pulse S1, next applies an MPG pulse MPG1, next applies an inverted RF pulse R180 and a slice-select pulse S2, and next applies an MPG pulse MPG2. Subsequently, the apparatus applies a read pulse RDx to one read axis (x-direction) and a read pulse RDy to another read axis (y-direction) so that the vector-composed read gradient has a direction of angle θi of a virtual radial line on the slice plane, and collects data for imaging from echoes e. The apparatus implements once or repeats the series of pulse application and data collection while inverting the polarity of the read pulses RDx and RDy and varying the areas of the read pulses RDx and RDy thereby to vary the angle θi so that the echoes e settle, thereby collecting data necessary for image reconstruction.

7 Claims, 5 Drawing Sheets

Diffusion-weighted radial EPI pulse sequence with addition of navigation echoes

DIFFUSION-WEIGHTED IMAGING METHOD AND APPARATUS FOR FAST PULSE SEQUENCE WITH MPG PULSES

BACKGROUND OF THE INVENTION

The present invention relates to an MRI (Magnetic Resonance Imaging) apparatus, and more particularly to an MRI apparatus which is capable of producing a diffusion-weighted image of a subject in a short scan time without being affected by a slight motion of the subject.

FIG. 5 is an explanatory diagram of the diffusion-weighted EPI (Echo Planar Imaging) pulse sequence, with two-dimensional navigation echoes being added thereto, which is disclosed in "Diffusion-Weighted Interleaved Echo-Planar Imaging with a Pair of Orthogonal Navigator Echoes", Kim Butts et al, MRM 35:763–770 (1996).

In this diffusion-weighted EPI pulse sequence A', an excitation RF pulse R90 and a slice-select pulse S1 are applied, an MPG (Motion Probing Gradient) pulse MPG1 is applied next, an inverted RF pulse R180 and a slice-select pulse S2 are applied next, and an MPG pulse MPG2 is applied next. Subsequently, in the presence of application of a phase-encoded pulse PE to the phase-encoding axis and the absence of application of a read pulse to the read axis, data for the correction of y-direction is collected from the navigation echo y. Subsequently, in the presence of application of a phase-encoded pulse PE to the phase-encoding axis and application of a read pulse RD' to the read axis, data for the correction of x-direction is collected from the navigation echo x. Subsequently, in the presence of application of a phase-encoded pulse PE to the phase-encoding axis and the inverted version of the read pulse RD', data for imaging is collected from echoes e'. This series of pulse application and data collection is repeated.

The above-mentioned diffusion-weighted EPI pulse sequence A' is repeated a number of times thereby to collect data necessary for image reconstruction based on the number of times of excitation.

Subsequently, the phase shift among the imaging data which have been collected by the number of times of the diffusion-weighted EPI pulse sequence A' is corrected by use of the navigation echoes y and x.

A diffusion-weighted image is produced from the corrected data based on the two-dimensional Fourier scheme.

There is disclosed a diffusion-weighted imaging method using the radial scanning method in "Analysis and Comparison of Motion-Correction Technique in Diffusion-Weighted Imaging", Theodore P. Trouard et al., JMRI 6:925–939 (1996).

This diffusion-weighted imaging method based on the radial scanning method repeats a pulse sequence, in which a gradient pulse is applied so that the gradient magnetic field has a direction of θi and data is collected, while varying the θi, thereby collecting data necessary for image reconstruction based on the number of times of excitation.

A diffusion-weighted image is produced from the data based on the projection reconstruction scheme.

The foregoing prior art diffusion-weighted EPI pulse sequence A', with two-dimensional navigation echoes being added thereto, uses the navigation echoes y and x to correct the phase shift caused by a slight motion of the subject in the y and x directions. However, it has no ability to cope with a phase shift caused by a slight motion of the subject in the z direction, and there arises actually a problem of the influence of a slight motion of the subject appearing in the image.

In contrast, the foregoing prior art diffusion-weighted imaging method using the radial scanning method is advantageous in that it is not affected by the phase shift caused by a slight motion of the subject owing to the use of only frequency encoding. However, it involves a problem of a long scan time for the collection of data necessary for image reconstruction based on a number of times (64 or more) of excitation.

SUMMARY OF THE INVENTION

Accordingly, it is an object of the present invention to provide an MRI apparatus which is capable of producing a diffusion-weighted image of a subject in a short scan time without being affected by a slight motion of the subject.

At a first viewpoint, the present invention provides an MRI apparatus which comprises an RF pulse transmission means, a gradient pulse application means, an NMR signal reception means, and a processing means which operates on these means to collect data and reconstruct an image, the processing means basing the operation on a fast pulse sequence which is a fast pulse sequence of the projection restoration scheme, with MPG pulses being incorporated therein, thereby collecting data necessary for image reconstruction based on the single excitation or the repetition of the fast pulse sequence a number of times thereby to collect data necessary for image reconstruction based on the number of times of excitation.

The term "fast pulse sequence" mentioned above signifies a pulse sequence by which data is collected from multiple echoes based on the single excitation.

The MRI apparatus of the first viewpoint, which is based on the projection restoration scheme using only frequency encoding, is not affected by the phase shift caused by a slight motion of the subject. It uses a fast pulse sequence for collecting data from multiple echoes based on the single excitation, and therefore the scan time can be reduced. Based on the fast pulse sequence which incorporates MPG pulses, a diffusion-weighted image can be obtained. In consequence, it becomes possible to obtain a diffusion-weighted image in a short scan time without being affected by a slight motion of the subject.

In the case of collecting data necessary for image reconstruction based on the single excitation, the scan time can be minimized.

On the other hand, in the case of collecting data necessary for image reconstruction based on a number of times of excitation, only echoes having large signal levels are used (it is unnecessary to use echoes of small signal levels), and therefore the s/n characteristics can be improved. The number in the term "a number of times" mentioned here is equal to a number of pieces of data necessary for image reconstruction divided by a number of pieces of data obtained by one excitation (i.e., number of echoes used).

At a second viewpoint, the present invention provides an MRI apparatus which comprises an RF pulse transmission means, a gradient pulse application means, an NMR signal reception means, and a processing means which operates on these means to collect data and reconstruct an image, the processing means basing the operation on a fast pulse sequence, in which an excitation RF pulse and a slice-select pulse are applied, an MPG pulse is applied next, an inverted RF pulse and a slice-select pulse are applied next, an MPG pulse is applied next, and a read pulse is applied next to collect data so that the read gradient has a direction of angle θi of a virtual radial line on the slice plane, with this series of pulse application and data collection being repeated while reversing the polarity of the read pulse and varying the angle θi, thereby collecting data necessary for image reconstruction based on the single excitation or the repetition of the fast pulse sequence a number of times thereby to collect data necessary for image reconstruction based on the number of times of excitation.

The MRI apparatus of the second viewpoint uses a fast pulse sequence for collecting data by application of a read pulse so that the read pulse has a direction of angle θi, and repeats the pulse sequence while varying the angle θi. This fast pulse sequence is a fast pulse sequence based on the projection restoration scheme which uses only frequency encoding, and therefore it is not affected by the phase shift caused by a slight motion of the subject and it can reduce the scan time. Based on the fast pulse sequence which incorporates MPG pulses before and after the inverted RF pulse, a diffusion-weighted image can be obtained. In consequence, it becomes possible to obtain a diffusion-weighted image in a short scan time without being affected by a slight motion of the subject.

At other viewpoint, the present invention provides a method of diffusion-weighted imaging based on a fast pulse sequence, with MPG pulses being incorporated therein, the method collecting data necessary for image reconstruction based on the single excitation or the repetition of the fast pulse sequence a number of times thereby to collect data necessary for image reconstruction based on the number of times of excitation.

The present invention also provides a method of diffusion-weighted imaging, in which an excitation RF pulse and a slice-select pulse are applied, an MPG pulse is applied next, an inverted RF pulse and a slice-select pulse are applied next, an MPG pulse is applied next, and a read pulse is applied next to collect data so that the read gradient has a direction of angle θi of a virtual radial line on the slice plane, with this series of pulse application and data collection being repeated while reversing the polarity of the read pulse and varying the angle θi, thereby collecting data necessary for image reconstruction based on the single excitation or the repetition of the fast pulse sequence a number of times thereby to collect data necessary for image reconstruction based on the number of times of excitation.

The MRI apparatus of this invention, which is based on the projection restoration scheme using only frequency encoding is not affected by the phase shift caused by a slight motion of the subject. It uses a fast pulse sequence and accordingly can reduce the scan time. Based on the fast pulse sequence which incorporates MPG pulses, a diffusion-weighted image can be obtained. In consequence, it becomes possible to obtain a diffusion-weighted image in a short scan time without being affected by a slight motion of the subject.

Further objects and advantages of the present invention will be apparent from the following description of the preferred embodiments of the invention as illustrated in the accompanying drawings.

DESCRIPTION OF THE PREFERRED EMBODIMENT

An embodiment of the present invention will be explained in more detail with reference to the drawings.

Figure 1:
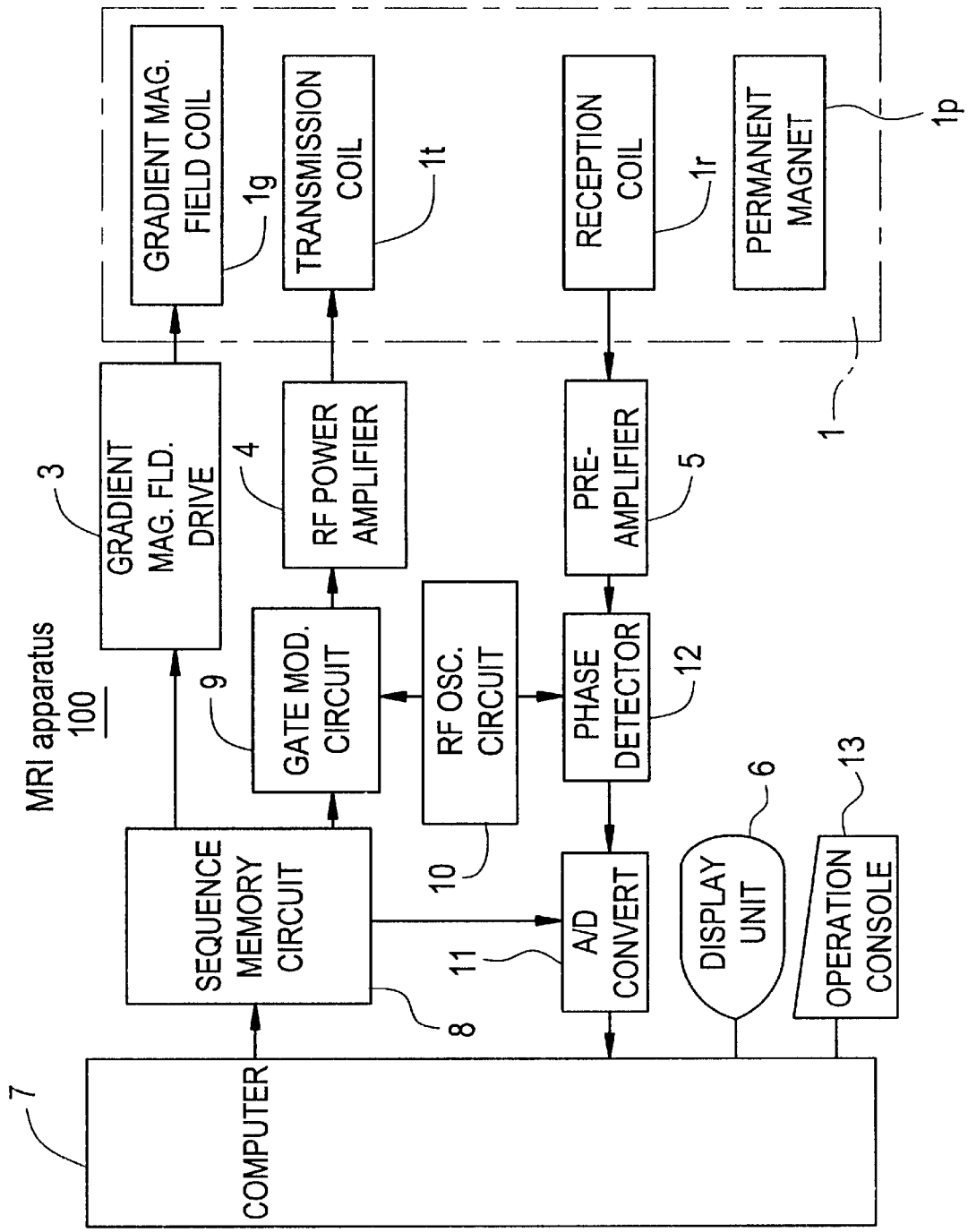
FIG. 1 is a block diagram showing the MRI apparatus based on an embodiment of this invention.

FIG.1 shows by block diagram the MRI apparatus based on an embodiment of this invention.

In this MRI apparatus 100, a magnet assembly 1 has a room section (bore) in which a subject of inspection is placed. Disposed around the room section are a permanent magnet 1p, a gradient magnetic field coil 1g, a transmission coil it which produces an RF pulse for inducing the spin of atomic nucleus in the subject, and a reception coil 1r which detects the NMR signal from the subject. The gradient magnetic field coil 1g, transmission coil it and reception coil 1r are connected to a gradient magnetic field drive circuit 3, RF power amplifier 4 and pre-amplifier 5, respectively.

The permanent magnet 1p may be replaced with a magnet of the superconduction type or ordinary conduction type.

A sequence memory circuit 8, which operates in accordance with the commands from a computer 7 and based on the stored pulse sequence, operates on the gradient magnetic field drive circuit 3 so that the gradient magnetic field coil 1g of the magnet assembly 1 generates a gradient pulse, operates on a gate modulation circuit 9 to modulate the carrier output signal of an RF oscillation circuit 10 into a pulse signal having a certain timing and certain envelope, puts the resulting RF pulse in the RF power amplifier 4, and applies the amplified RF pulse to the transmission coil it of the magnet assembly 1 so that a selected slice region is excited.

The pre-amplifier 5 amplifies the NMR signal from the subject detected by the reception coil 1r of the magnet assembly 1 and puts the amplified signal in a phase detector 12. The phase detector 12 implements the phase detection for the NMR signal from the pre-amplifier 5 based on the carrier output signal of the RF oscillation circuit 10 and puts the resulting signal in an A/D converter 11. The A/D converter 11 converts the analog phase-detected signal into a digital data and puts the data in the computer 7.

The computer 7 which receives the data from the A/D converter 11 implements the calculation of image reconstruction to produce an image. The resulting image is displayed on a display unit 6.

The computer 7 also implements general control including the entry of information from an operation console 13.

Figure 2:
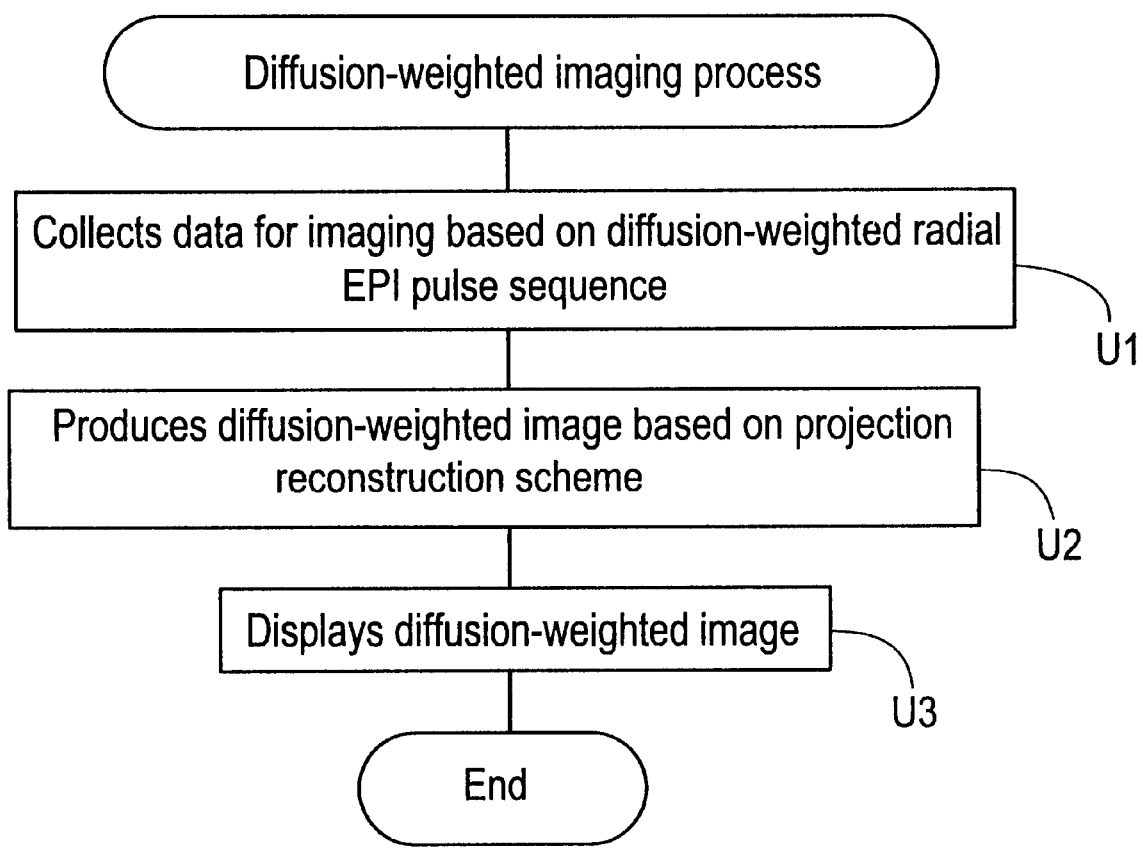
FIG. 2 is a flowchart showing the diffusion-weighted imaging process based on this invention.

FIG. 2 shows by flowchart the diffusion-weighted imaging process performed by the MRI apparatus 100.

Step U1 collects data for imaging based on the diffusion-weighted radial EPI pulse sequence.

Figure 3:
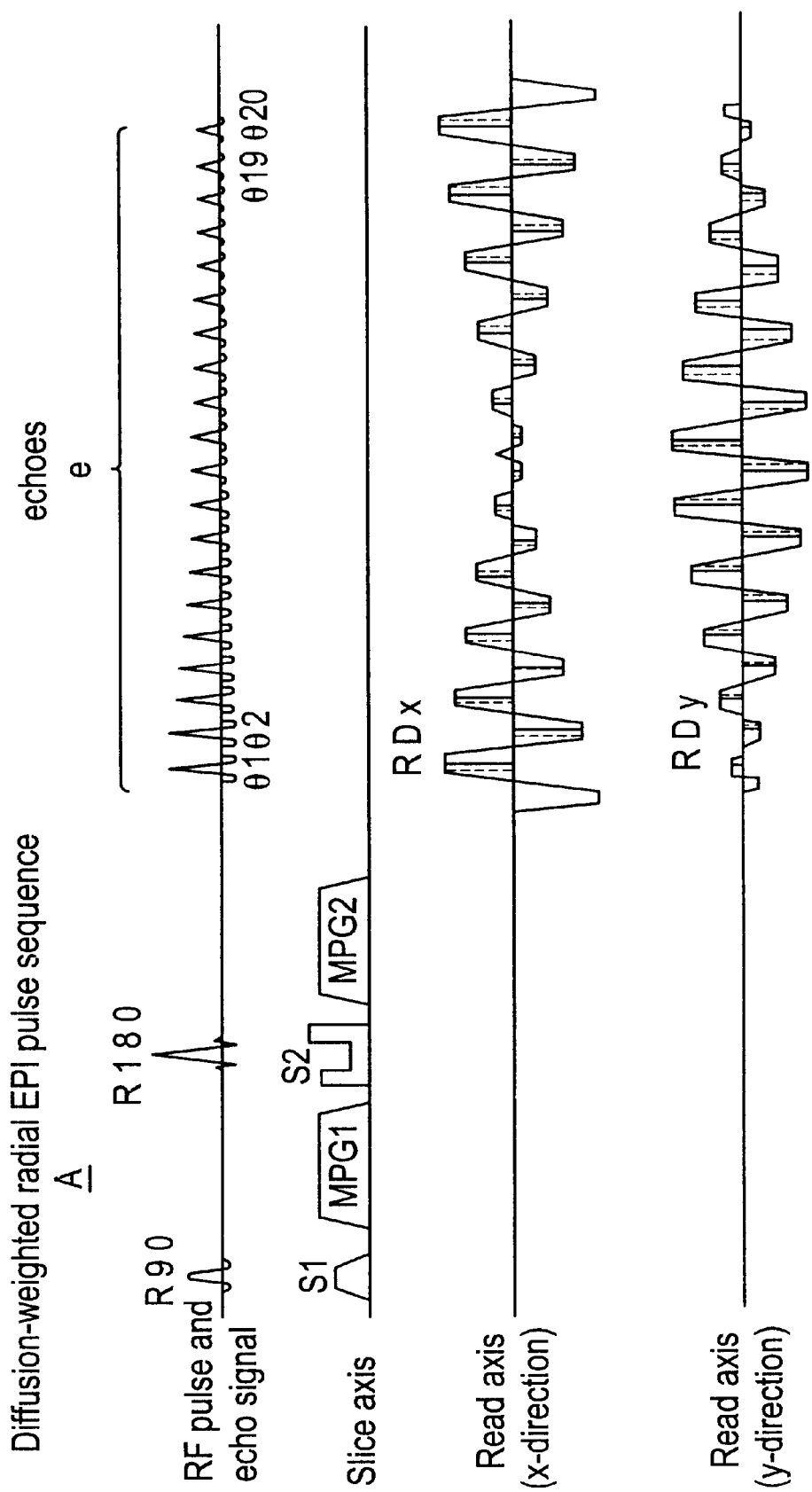
FIG. 3 is a timing chart showing an example of the diffusion-weighted radial EPI pulse sequence based on this invent.

FIG. 3 shows the diffusion-weighted radial EPI pulse sequence. The diffusion-weighted radial EPI pulse sequence A applies an excitation RF pulse R90 and a slice-select pulse S1, next applies an MPG pulse MPG1, next applies an inverted RF pulse R180 and a slice-select pulse S2, and next applies an MPG pulse MPG2. Subsequently, the pulse sequence applies a read pulse RDx to one read axis (x-direction) and a read pulse RDy to another read axis (y-direction) so that the vector-composed read gradient has a direction of angle θi (i takes 1 through 20 in FIG. 3) of a virtual radial line on the slice plane, and collects data for imaging from echoes e. This pulse sequence A is repeated while inverting the polarity of the read pulses RDx and RDy and varying the areas of the read pulses RDx and RDy thereby to vary the angle θi so that the echoes e settle.

The diffusion-weighted radial EPI pulse sequence A is repeated a number of times to collect data necessary for image reconstruction based on the number of times of excitation.

Figure 4:
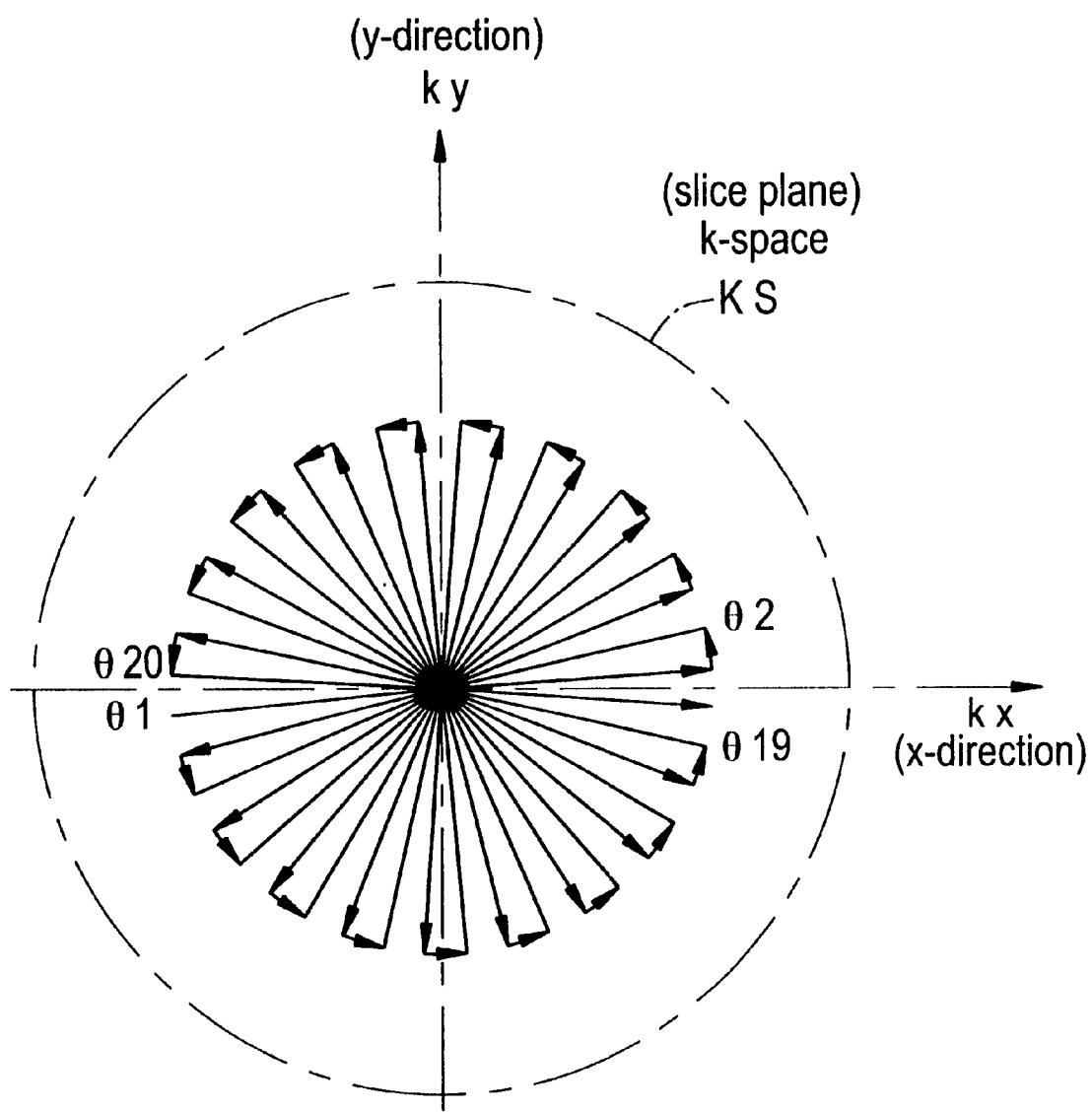
FIG. 4 is an explanatory diagram of the locus of data collection for imaging in the k-space based on the diffusion-weighted radial EPI pulse sequence shown in FIG.3.
Figure 5:
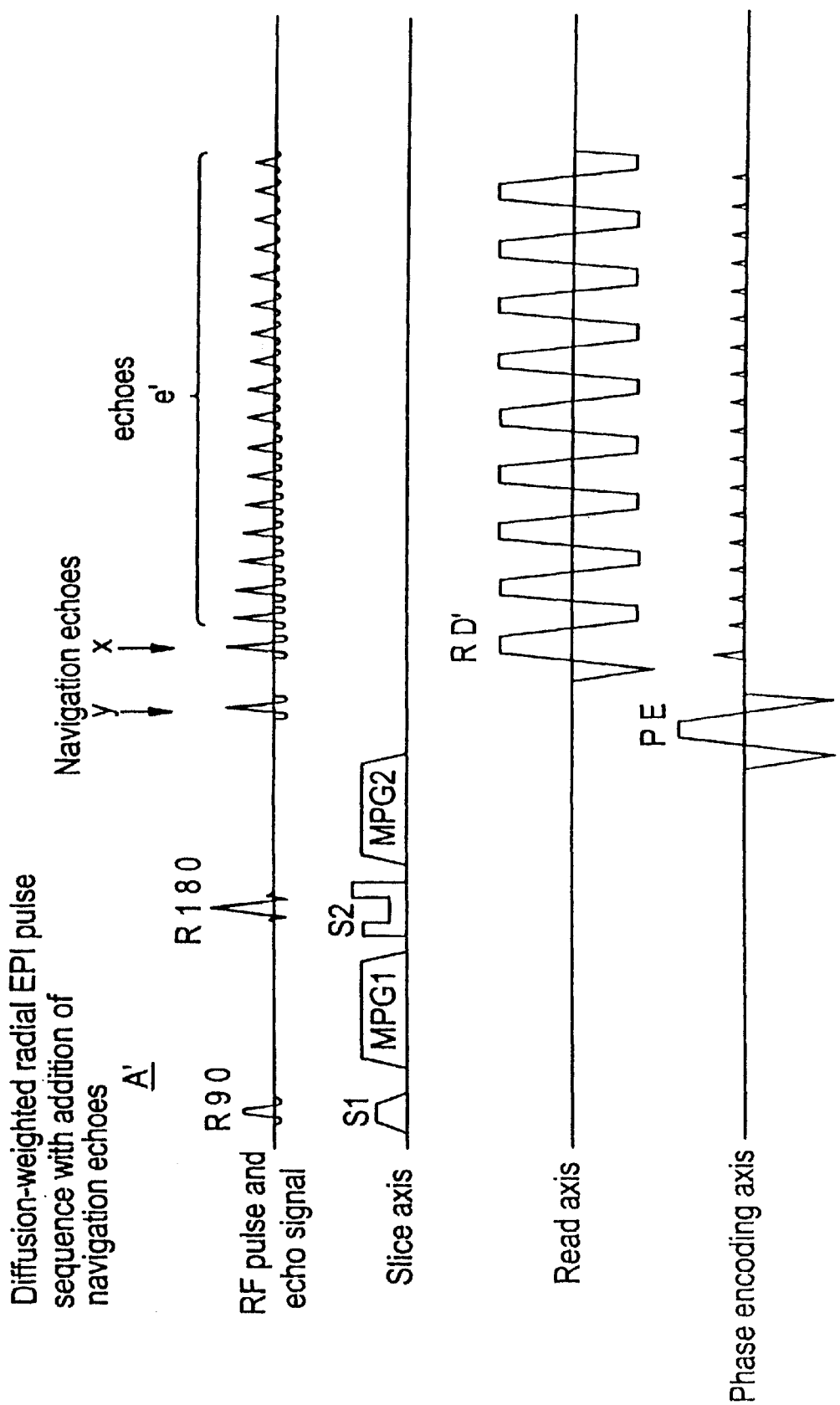
FIG. 5 is a timing chart showing an example of the conventional diffusion-weighted radial EPI pulse sequence.

FIG. 4 shows the locus in k-space KS of data collection for imaging based on the diffusion-weighted radial EPI pulse sequence A shown in FIG. 3. In the figure, each angle θi represents a direction of data collection locus, which corresponds to the direction of vector-composed read gradient, and each arrow indicates the direction of data collection.

The number (i) of angles is 20 expediently in FIG. 4, and if 20 pieces of data (20 echoes) can be obtained by one excitation as shown in FIG. 3, it is enough to implement the diffusion weighted radial EPI pulse sequence A only once.

Actually, however, at least 60 echoes are used to obtain an image having a quality of minimum requirement. Therefore, if 20 pieces of data is obtained by one excitation as shown in FIG. 3, the diffusion-weighted radial EPI pulse sequence A must be repeated three times. Otherwise, if 60 pieces of data is obtained by one excitation, it is enough to implement the diffusion-weighted radial EPI pulse sequence A once. In this case, the scan time can be reduced as compared with the case of collecting data necessary for image reconstruction based on the number of times of excitation. However, echoes having small signal levels must be used, and therefore a high-quality image cannot be obtained due to degraded s/n characteristics.

Returning to FIG. 2, step U2 produces a diffusion-weighted image from the collected data based on the projection reconstruction scheme. Specifically, the collected data is rendered the first-degree Fourier transformation, rearrangement, and amplitude correction for T2* (attenuation time constant of lateral relaxation time T2), and the absolute values are summed (reconstruction based on the back projection) to produce a diffusion-weighted image.

Step U3 displays the produced diffusion-weighted image.

The foregoing MRI apparatus 100 uses the diffusion-weighted radial EPI pulse sequence A which is a fast pulse sequence of the projection restoration scheme using only frequency encoding, and therefore it becomes possible to obtain a diffusion-weighted image in a short scan time without being affected by a slight motion of the subject.

Many widely deferent embodiments of the invention may be constructed without departing from the spirit and the scope of the present invention. It should be understood that the present invention is not limited to the specific embodiments described in the specific embodiments described in the specification, except as defined in the appended claims.

What is claimed is:

1. A method of diffusion-weighted imaging, comprising the steps of:
    applying an excitation RF pulse and a first slice-select pulse;
    then applying a first MPG pulse;
    applying an inverse excitation RF pulse and a second slice-select pulse;
    then, applying a second MPG pulse;
    applying a series of first varying read pulses to one read axis;
    applying a series of second varying read pulses to another read axis which is orthogonal to said one read axis so that a vector-composed read gradient has a direction of angle θ of a virtual radial line on a slice plane; and
    collecting data from echoes for imaging, whereby images are obtained in a short scan time without being affected by phase shift resulting from motion of a subject being examined.

2. The method of claim 1, wherein sequence of steps is repeated while inverting the polarity of said first and second read pulses, and varying duration and/or amplitude of each of said first and second read pulses.

3. The method of claim 1, wherein angle θ represents a direction of data collection locus and ranges from 1 to 20.

4. An MRI apparatus comprising:
    means for applying an excitation RF pulse and a first slice-select pulse;
    means for applying a first MPG pulse;
    means for applying an inverse excitation RF pulse and a second slice-select pulse;
    means for applying a second MPG pulse;
    means for applying a series of first varying read pulses to one read axis;
    means for applying a series of second varying read pulses to another read axis which is orthogonal to said one read axis so that a vector-composed read gradient has a direction of angle θ of a virtual radial line on a slice plane; and
    means for collecting data from echoes for imaging, whereby images are obtained in a short scan time without being affected by phase shift resulting from motion of a subject being examined.

5. The apparatus of claim 4, wherein said means for applying said series of first varying read pulses comprises means for inverting the polarity of said series of first varying read pulses; and wherein said means for applying a series of second varying read pulses comprises means for inverting the polarity of said series of second varying pulses.

6. The apparatus of claim 4, wherein said means for applying a series of first varying read pulses comprises means for varying duration and/or amplitude of said series of said first varying pulses, and wherein said means for applying a series of second varying read pulses comprises means for varying duration and/or amplitude of said series of second varying pulses.

7. The method of claim 4, wherein said angle θ represents a direction of data collection locus and ranges from 1 to 20.

* * * * *